United States Patent
Proell et al.

(10) Patent No.: US 6,906,972 B2
(45) Date of Patent: Jun. 14, 2005

(54) INTEGRATED DRAM SEMICONDUCTOR MEMORY AND METHOD FOR OPERATING THE SAME

(75) Inventors: Manfred Proell, Dorfen (DE); Stephan Schroeder, Munich (DE); Ralf Schneider, München (DE); Joerg Kliewer, Munich (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/733,332

(22) Filed: Dec. 12, 2003

(65) Prior Publication Data

US 2004/0170049 A1 Sep. 2, 2004

(30) Foreign Application Priority Data

Dec. 12, 2002 (DE) ........................................ 102 58 168

(51) Int. Cl.$^7$ ................................................ G11C 7/00
(52) U.S. Cl. .................... 365/203; 365/189.01; 365/205
(58) Field of Search ........................... 365/203, 189.01, 365/205, 230.03

(56) References Cited

U.S. PATENT DOCUMENTS 5,798,975 A  8/1998  Bottner et al.
6,310,808 B1 * 10/2001 Tanizaki ..................... 365/203
2002/0067653 A1  6/2002  Toda

FOREIGN PATENT DOCUMENTS

DE  196 32 780 A1  2/1998

* cited by examiner

Primary Examiner—David Lam
(74) Attorney, Agent, or Firm—Slater & Matsil, L.L.P.

(57) ABSTRACT

An integrated semiconductor memory, and method for operating such a memory, in particular a DRAM memory, having local data lines (LDQT, LDQC) segmented in the column direction (Y), which local data lines can be connected by a CSL switch in response to a column select signal fed via a CSL line (CSL) running in the row direction (X) to primary sense amplifiers for transferring or accepting spread data signals to or from bit lines of the respective segment (I, II, III), LDQ switches are arranged at the interfaces between adjacent segments of the local data lines (LDQT, LDQC) for their connection to the local data lines (LDQT, LDQC) of adjacent segments (I, II, III). LDQ switches, depending on a control signal fed separately to each of said LDQ switches, are closed during a precharge phase, which takes place before each read cycle, of at least two adjacent LDQ segments.

14 Claims, 3 Drawing Sheets

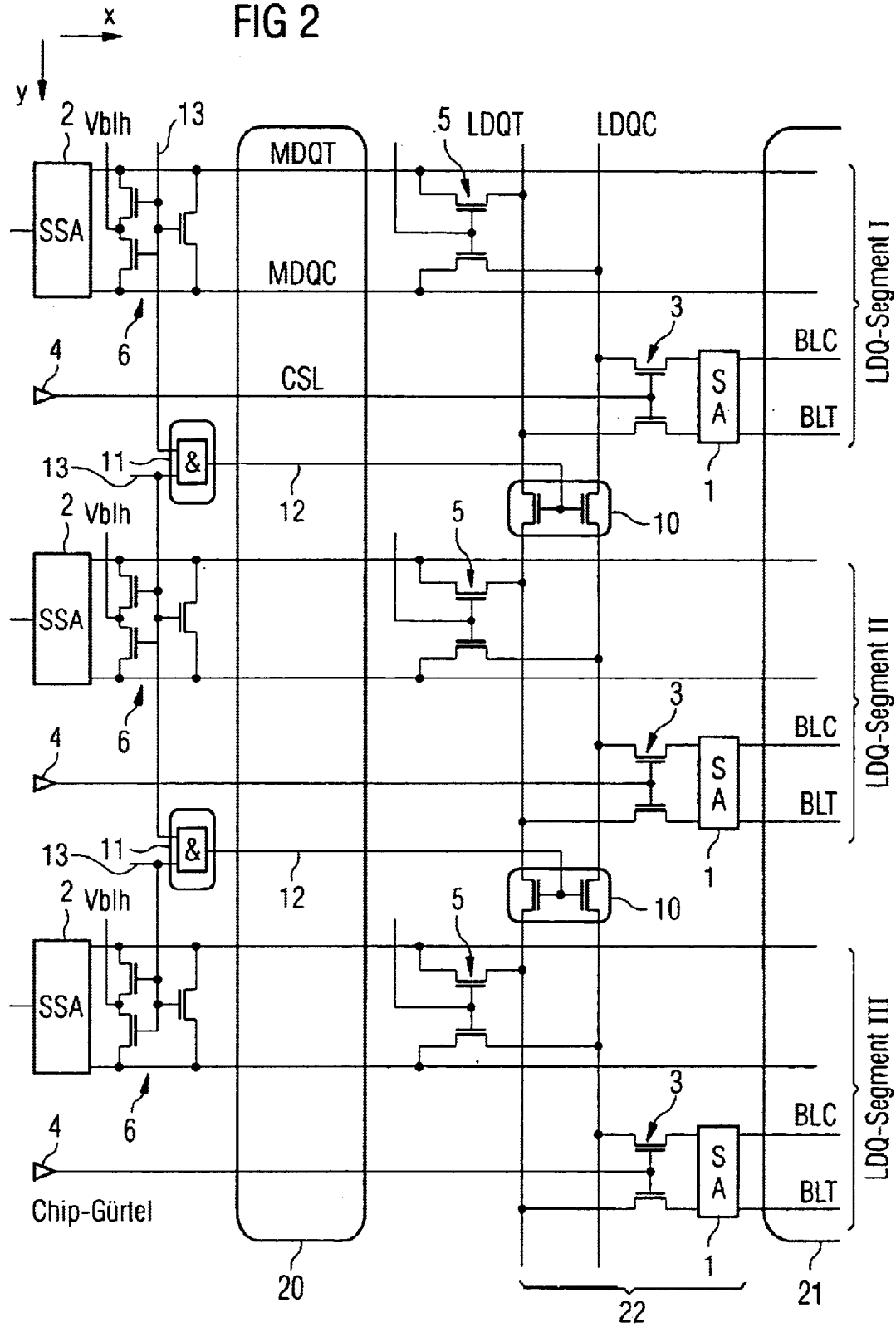

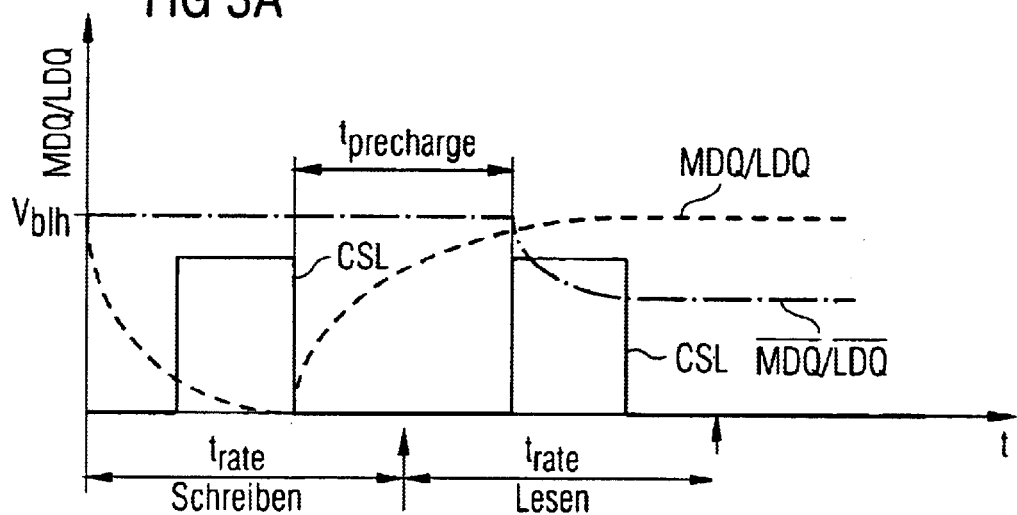
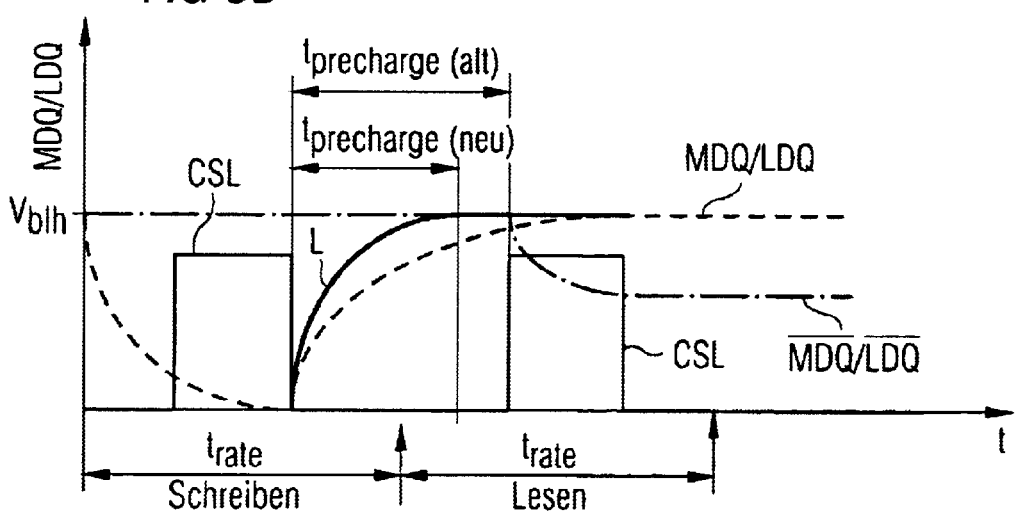

INTEGRATED DRAM SEMICONDUCTOR MEMORY AND METHOD FOR OPERATING THE SAME

BACKGROUND

1. Field of the Invention

The present invention relates to an integrated DRAM semiconductor memory and a method for operating the same.

2. Background Information

In a read cycle for integrated semiconductor memories, such as dynamic memory modules (DRAMs), in order to transport the evaluated bit line levels to the chip output, the bit line signals spread by a primary sense amplifier are switched onto local data lines (LDQs) via CSL switches in a first stage. For power-saving reasons, and in order that the primary sense amplifier that spreads the bit lines BL can drive the bit line signals within a short time on the LDQ, the capacitance of the LDQs that is to be subjected to charge reversal is usually reduced by segmentation or division of the same.

FIG. 1 shows a section of a cell array of a conventional DRAM memory with two cell blocks 20, 21. Situated between the two cell blocks is a SA strip 22, in which the above-mentioned primary sense amplifiers (SA) 1, the CSL switches 3, the segmented local data lines LDQT, LDQC and MDQ switches 5 are arranged. Three LDQ segments, designated by I, II and III are illustrated by way of example in FIG. 1. Complementary bit lines BLT, BLC, which run in each cell block 20, 21 in the row direction X, are connected to the primary SAs 1. Each SA outputs the bit line potentials to the local data lines LDQT and LDQC in the event of driving of the assigned CSL switch 3 by a CSL control signal, generated by a CSL driver 4, during a read operation. At this point in time, the local data lines LDQT, LDQC have already been connected by the MDQ switch 5 to an associated main data line MDQT, MDQC, which is in turn connected to a secondary sense amplifier (SSA) 2.

Consequently, a plurality of LDQ segments I, II and III are formed along a word line in each cell block 20, 21 which word line runs in the column direction Y and is not shown in FIG. 1 and the local data lines LDQT, LDQC thus segmented are connected at times, that is to say during a read cycle and a write cycle, via the MDQ switches 5 to a main data line MDQT, MDQC common to all the local data lines of an LDQ segment, and via said main data line to the SSA 2. It should be mentioned that the bit lines BLT, BLC, the primary sense amplifiers 1, the CSL switches 3, the local data lines LDQT, LDQC, the MDQ switches 5 and the main data lines MDQT, MDQC are set up for carrying or switching through differential or complementary data signals.

FIG. 3A shows a temporal sequence of a typical write-read cycle on the basis of the potentials on the connected main data lines MDQT, MDQC and local data lines LDQT, LDQC. During writing, the SSA 2 spreads the MDQ/LDQ lines to the full bit line level Vblh and, by means of a short pulsed CSL signal, the potentials are written to the bit lines BLT, BLC, the SA 1 being overwritten (toggled) under certain circumstances. Immediately after the end of the CSL pulse signal, the precharge of the MDQ/LDQ lines is begun, in order to find the MDQ/LDQ lines at the same potential in the event of a read command as a result of a renewed CSL pulse signal in the same LDQ segment. This precharge operation is carried out by an equalize (EQL) control circuit 6 arranged at the secondary sense amplifier 2 in the chip belt, in response to a precharge control signal 13. The precharge level is not a center level but rather the full bit line level Vblh on the true and complementary lines MDQT, MDQC and LDQT, LDQC.

FIG. 3A reveals that a shortening of the external cycle time or an increase in the cycle frequency during the transmission of the write-read commands is tantamount to a shortening of the precharge time $t_{precharge}$, since the length of the CSL pulse signal remains constant. By virtue of input-high-impedance contacts driven by the process technology within the MDQ switches 5, the precharge carried out on the main data lines MDQT, MDQC can have an effect on the local data lines LDQT, LDQC only in a time-delayed manner. However, assuming inverted (logical) data between write and read commands, this can have the effect that the signal on the bit line BLT, BLC that is switched on to the local data lines LDQT and LDQC during the read operation by the primary sense amplifier 1 via the CSL switch 3 is not strong enough to generate a sufficient differential signal on the complementary local data lines LDQT, LDQC. This can lead to an incorrect evaluation of the secondary sense amplifier.

In the worst case, the complementary local data lines LDQT, LDQC are still fully spread (a precharge could not yet take place) when the CSL pulse signal of the read command arrives. Analogously to a write command, this leads to the toggling of the SA 1 and thus to the writing back of the incorrect data information. What is problematic in this case is primarily the fact that only one MDQ switch 5 is used per LDQ segment in order to switch through the LDQ precharge. This results in a high susceptibility which causes the semiconductor memory module to fail beyond the repair limit.

DE 196 32 780 A1 (see, in particular, FIG. 3 with description) discloses a semiconductor memory in which, in order to accelerate a precharge operation, which is called "restore" in this document, at least two of the bit line pairs are connected via the bit line switches that are present anyway.

SUMMARY

An integrated semiconductor memory, in particular DRAM memory of the generic type, and a method for operating the same are described in that general pre-charge performance of the main data lines MDQ and of the local data lines LDQ is improved, and the dependence on the individual MDQ switches decreases.

In accordance with a first aspect, an integrated DRAM semiconductor memory is described, having local data lines segmented in a column direction and having a CSL switch. The CSL switch connects the local data lines in response to a column select signal fed via a CSL line running in a row direction to primary sense amplifiers, for transferring and accepting spread data signals to and from bit lines of respective segments. LDQ switches are arranged at the interfaces between adjacent segments of local data lines for their connection to the local data lines of adjacent segments. The LDQ switches, depending on a control signal fed separately to each of said LDQ switches, are closed during a pre-charge phase—which takes place before read cycles—of at least two adjacent LDQ segments, and are otherwise open.

In order to generate a control signal which drives each LDQ switch, "AND" elements are provided, which combine the precharge control signals fed to the EQL control circuits of at least two adjacent LDQ segments.

In accordance with a second aspect, a method is described for operating an integrated DRAM semiconductor memory having local data lines segmented in the column direction and main data lines running in the row direction. Main data lines are common to local data lines of an LDQ segment and the local data lines are connected by a CSL switch in response to a column select signal fed to the latter, during at least one of a read or write cycle, to a primary sense amplifier, in each case for reading or writing of spread data. The local data lines of at least two adjacent LDQ segments are connected to one another during a precharge phase before each read cycle, which is activated by an activation of the CSL switch by means of the column select signal.

What is achieved by the connection of the local data lines of at least two adjacent LDQ segments to the LDQ switch is that, in the precharge phase, the local data line of an LDQ segment is precharged (precharge) via at least two instead of one MDQ switch. Since the adjacent LDQ segments have already been in precharge for longer, they support the charge equalization and thus alleviate the read access—which is critical with regard to the precharge time—to the same LDQ segment with inverted data relative to the preceding write command.

The above and further advantageous features will become even clearer in the description below of a preferred exemplary embodiment of an integrated DRAM semiconductor memory according to the invention and of a method for operating the same.

DESCRIPTION OF THE DRAWINGS

FIG. 2 shows, schematically and partly as a block diagram, the structure of a section of a DRAM memory configured according to the invention;

FIG. 3A shows the temporal sequence of a customary write-read cycle on the basis of the potentials on the connected MDQ/LDQ lines; and FIG. 3B shows the temporal sequence of a write/read cycle according to the invention.

DETAILED DESCRIPTION OF THE INVENTION

Figure 1:
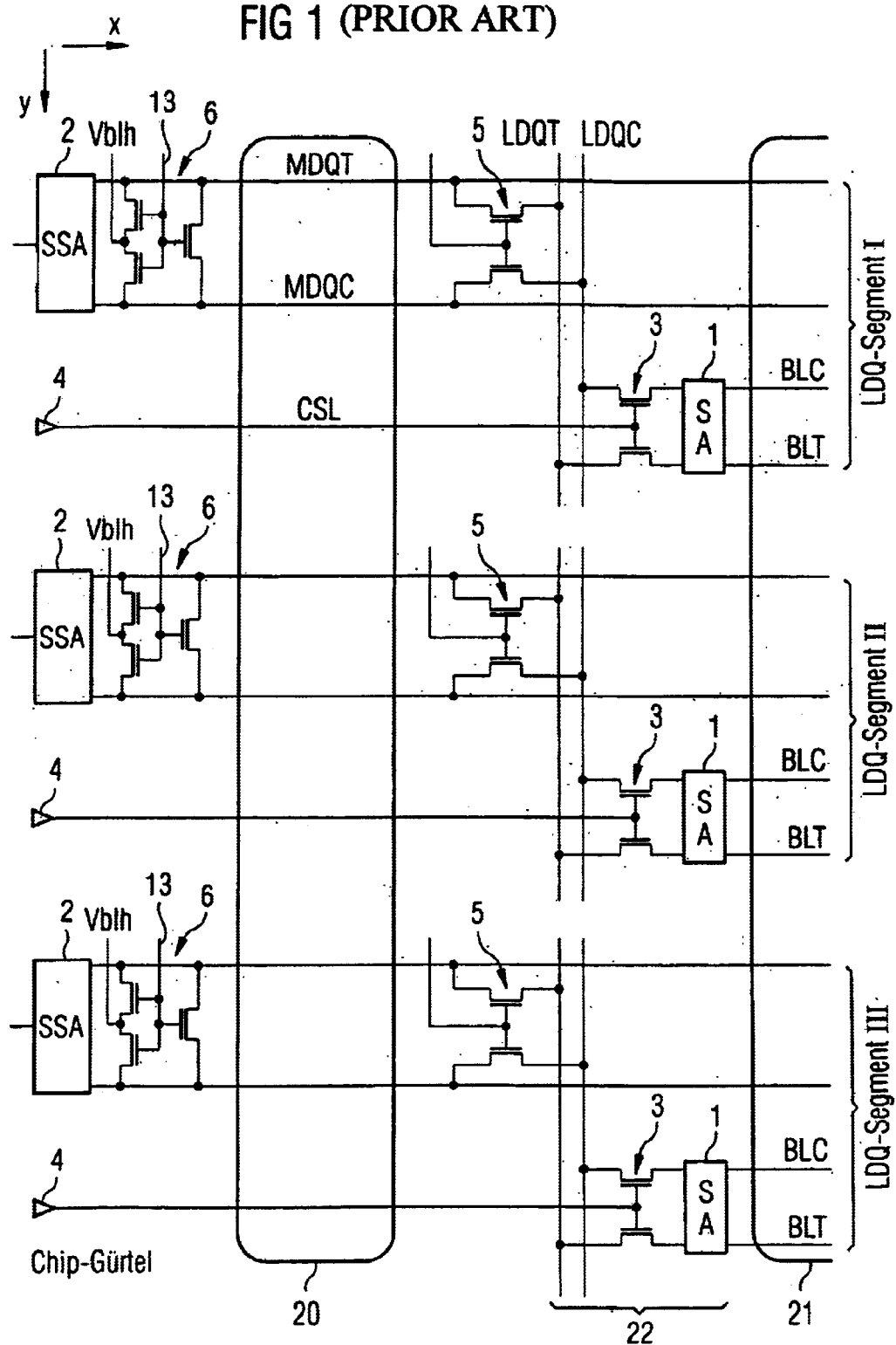
FIG. 1 shows, schematically and partly as a block diagram, a structure of a section of a conventional DRAM memory.

The following reference symbols are used in the connection with the following description:
1 Sense amplifier SA
2 Secondary sense amplifier SSA
3 CSL switch
4 CSL driver
5 MDQ switch
6 EQL control circuit
10 LDQ switch
11 AND elements
12 LDQ switch control line
13 Precharge control signals
20, 21 Cell blocks
22 SA strips
BLT, BLC Bit lines
LDQT, LDQC Local data lines
MDQT, MDQC Main data lines
CSL Column select line
Vblh Full bit line voltage
L New precharge charging function
X Row Direction
Y Column direction
I, II, III LDQ segments A DRAM semiconductor memory and method for operating the same is disclosed in U.S. Pat. No. 2002/0067653 A1, the disclosure of which is incorporated by reference in its entirety.

In FIG. 2, which shows, schematically and partly as a block diagram, a section of a DRAM memory configured in accordance with an embodiment of the invention, the LDQ switches designated by 10 are arranged in the SA strip 22, in each case between adjacent LDQ segments I, II, III, and connect the local data lines LDQT and LDQC of two adjacent LDQ segments in response to a control signal fed via a line 12 connected separately to each LDQ switch. It should be noted that the LDQ switches 10 are realized as FET transistor switch pairs, with a common gate terminal to which the line 12 feeding the control signal is connected. For generating said control signal, "AND" elements 11 are arranged in the chip belt, which "AND" elements "AND" the EQL control signals 13 of two adjacent EQL control circuits 6. Additional elements 10 and 11 that are illustrated in FIG. 2 improve the precharge performance, as mentioned. A method for operating the DRAM memory shown in FIG. 2 will now be explained with reference to FIG. 3B, which shows the temporal sequence of a write-read cycle.

FIG. 3B shows a time sequence of a write-read cycle with the potentials on the main data lines MDQT and MDQC. These are connected to local data lines LDQT, LDQC with the MDQ switch 5 activated. The CSL pulse signal issued during writing is followed by the precharge operation, which is carried out by the EQL control circuit 6. The precharge level is not a center level, but rather a full bit line level Vblh both on the true lines MDQT/LDQT and on the complementary lines MDQC/LDQC. According to an embodiment of the invention, the local data lines LDQT, on the one hand and LDQC on the other hand, of two adjacent LDQ segments are connected to one another during the precharge phase by the paired FET transistor switches of the LDQ switch 10. As a result, during the precharge phase, the local data lines LDQT and LDQC are precharged (precharge) by at least two EQL control circuits 6 of two adjacent LDQ segments via the associated main data lines and the activated MDQ switches 5. Since the adjacent LDQ segments already have been in precharge for longer, they support the charge equalization and thus alleviate the read access—which is critical with regard to the precharge time—to the same LDQ segment with inverted data relative to the preceding write operation. In the exemplary embodiment, the "AND" element 11 assigned to each LDQ switch 10 combines the precharge control signals 13 from the two adjacent EQL control circuits 6, which signals control the precharge phase.

In FIG. 3B, a thick solid curve L shows the new precharge charging function with the shortened new precharge time $t_{precharge}$ (new). The shortening of the precharge time has the effect that the semiconductor memory module can be operated with higher frequencies before it fails due to the MDQ/LDQ precharge. This measure thus results in an improvement of the yield of functional products and in an increase in the tolerance with respect to the specification.

The foregoing disclosure of the preferred embodiments of the present invention has been presented for purposes of illustration and description. It is not intended to be exhaustive or to limit the invention to the precise forms disclosed. Many variations and modifications of the embodiments described herein will be apparent to one of ordinary skill in the art in light of the above disclosure. The scope of the invention is to be defined only by the claims appended hereto, and by their equivalents.

Further, in describing representative embodiments of the present invention, the specification may have presented the method and/or process of the present invention as a particular sequence of steps. However, to the extent that the method or process does not rely on the particular order of steps set forth herein, the method or process should not be limited to the particular sequence of steps described. As one of ordinary skill in the art would appreciate, other sequences of steps may be possible. Therefore, the particular order of the steps set forth in the specification should not be construed as limitations on the claims. In addition, the claims directed to the method and/or process of the present invention should not be limited to the performance of their steps in the order written, and one skilled in the art can readily appreciate that the sequences may be varied and still remain within the spirit and scope of the present invention.

What is claimed is:

1. An integrated DRAM semiconductor memory, comprising:

local data lines segmented in a column direction and having a CSL switch, which connects the local data lines in response to a column select signal fed via a CSL line running in a row direction to primary sense amplifiers, at least during one of a read or write cycle, for transferring and accepting spread data signals to and from bit lines of a respective segment; and LDQ switches arranged at interfaces between adjacent segments of the local data lines for their connection to the local data lines of adjacent segments, which LDQ switches, depending on a control signal fed separately to each of said LDQ switches, are closed during a precharge phase, which takes place before each read cycle, of at least two adjacent LDQ segments.

2. The DRAM semiconductor memory as in claim 1, wherein the LDQ switches that are closed during a precharge phase are otherwise open.

3. The DRAM semiconductor memory as in claim 1, wherein the CSL switch connects the local data lines in response to a column select signal fed via a CSL line during a read and write cycle.

4. The DRAM semiconductor memory as in claim 3, wherein local data lines of a segment are connected via an MDQ switch to a main data line, which runs in the row direction and is common to local data lines of a segment, and to a secondary sense amplifier for accepting/transferring spread data signals in a write/read cycle.

5. The DRAM semiconductor memory as in claim 3, wherein the write and read data are complementary data, and wherein the local data lines and the main data lines are arranged as complementary data lines.

6. The DRAM semiconductor memory as in claim 5, wherein, the CSL switches, the MDQ switches and the LDQ switches are arranged for the complementary local and main data lines as FET transistor pairs with common gate driving.

7. The DRAM semiconductor memory as in claim 1, wherein each LDQ switch is assigned an AND element in order to logically combine the precharge phase condition of the at least two adjacent LDQ segments and to generate therefrom the control signal for the respective LDQ switch.

8. The DRAM semiconductor memory as in claim 1, wherein cell arrays of the semiconductor memory are subdivided in the row direction into individual cell blocks between which run, in the column direction, a sense amplifier strip with the primary sense amplifiers and the associated CSL switches, the local data lines, the MDQ switches and the LDQ switches likewise being arranged in said sense amplifier strip and the secondary sense amplifiers and the AND elements which generate the control signal being arranged in a chip belt of the integrated semiconductor memory.

9. A method for operating an integrated DRAM semiconductor memory, comprising:

providing local data lines segmented in a column direction and main data lines running in a row direction, having main data lines being common to local data lines of an LDQ segment and local data lines being connected by a common select line (CSL) switch in response to a column select signal fed to the latter, during at least one of a read or write cycle, to a primary sense amplifier for reading or writing of spread data; and connecting the local data lines of at least two adjacent LDQ segments to one another during a precharge phase before each read cycle, which is activated by an activation of the CSL switch by means of the column select signal.

10. The method of claim 9, further comprising assigning an AND element to an LDQ switch in order to logically combine the precharge phase condition of the at least two adjacent LDQ segments and to generate therefrom the control signal for the respective LDQ switch.

11. The method of claim 9, further comprising connecting local data lines of a segment via an MDQ switch to a main data line, which runs in the row direction and is common to local data lines of a segment, and to a secondary sense amplifier for accepting/transferring spread data signals in a write or read cycle.

12. The method of claim 9, further comprising subdividing cell arrays of the semiconductor memory in the row direction into individual cell blocks between which run, in the column direction, in each case a sense amplifier strip with the primary sense amplifiers and associated CSL switches, arranging local data lines, MDQ switches and LDQ switches in said sense amplifier strip, and arranging secondary sense amplifiers and AND elements which generate the control signal in a chip belt of the integrated semiconductor memory.

13. The method of claim 9, wherein write and read data are complementary data, and wherein the local data lines and the main data lines are in each case arranged as complementary data lines.

14. The method of claim 13, further comprising arranging CSL switches, MDQ switches and LDQ switches in each case for the complementary local and main data lines as FET transistor pairs with common gate driving.

* * * * *